(12) United States Patent
Huang et al.

(10) Patent No.: US 11,991,907 B2
(45) Date of Patent: May 21, 2024

(54) DISPLAY PANEL AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Xiaoxia Huang, Beijing (CN); Bing Ji, Beijing (CN); Shuang Zhang, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 519 days.

(21) Appl. No.: 17/282,806

(22) PCT Filed: Jun. 22, 2020

(86) PCT No.: PCT/CN2020/097552
§ 371 (c)(1),
(2) Date: Apr. 5, 2021

(87) PCT Pub. No.: WO2021/258269
PCT Pub. Date: Dec. 30, 2021

(65) Prior Publication Data
US 2022/0190089 A1 Jun. 16, 2022

(51) Int. Cl.
*H10K 59/131* (2023.01)
*G09G 3/00* (2006.01)
(52) U.S. Cl.
CPC .......... *H10K 59/131* (2023.02); *G09G 3/006* (2013.01)

(58) Field of Classification Search
CPC ...... H10K 59/131; H10K 71/70; G09G 3/006; G09G 2300/0426; H05K 1/189; H05K 2201/10128; G06F 3/041; H01L 23/544; H01L 27/12
See application file for complete search history.

(56) References Cited

U.S. PATENT DOCUMENTS

| | | | |
|---|---|---|---|
| 2015/0198641 A1* | 7/2015 | Moon | G09G 3/006 324/537 |
| 2017/0196080 A1 | 7/2017 | Meng et al. | |
| 2019/0018050 A1 | 1/2019 | Wang et al. | |
| 2020/0236792 A1 | 7/2020 | Dong et al. | |

FOREIGN PATENT DOCUMENTS

| | | |
|---|---|---|
| CN | 105632382 A | 6/2016 |
| CN | 106973520 A | 7/2017 |
| CN | 107658234 A | 2/2018 |
| CN | 110649039 A | 1/2020 |
| CN | 110718159 A | 1/2020 |

* cited by examiner

*Primary Examiner* — Kyoung Lee
(74) *Attorney, Agent, or Firm* — ArentFox Schiff LLP; Michael Fainberg

(57) ABSTRACT

The disclosure provides a display panel and a display device, including a display cell. The display cell includes: a plurality of display pins and a plurality of cell test pins, which are arranged in a bonding region of the display cell; and a chip on film bonded to a side facing away from a display surface of the display cell. An orthographic projection of the chip on film on the display cell completely covers the display pins and the cell test pins.

16 Claims, 3 Drawing Sheets

DISPLAY PANEL AND DISPLAY DEVICE

CROSS REFERENCE TO RELATED APPLICATIONS

This application is a national phase entry under 35 U.S.C. § 371 of International Application No. PCT/CN2020/097552, filed on Jun. 22, 2020, the entire content of which is incorporated herein by reference.

FIELD

This disclosure relates to the field of display technology, and in particular relates to a display panel and a display device.

BACKGROUND

An OLED display screen is a display screen based on Organic Light-Emitting Diode, has excellent characteristics of autoluminescence, high contrast, small thickness, wide field of view, fast response, applicability to a flexible panel, wide use temperature range, simple construction and manufacturing procedures, and the like, has attracted more and more attentions, and is wide in application prospect.

SUMMARY

In one aspect, embodiments of the disclosure provide a display panel, including a display cell and a chip on film.

The display cell includes: a plurality of display pins and a plurality of cell test pins. The plurality of display pins and the plurality of cell test pins are arranged in a bonding region of the display cell.

The chip on film is bonded to a side, facing away from a display surface of the display cell, of the display cell. An orthographic projection of the chip on film on the display cell completely covers the display pins and the cell test pins.

Optionally in the above display panel provided by the embodiments of the disclosure, the chip on film includes: connection pins bonded to the display pins in a one-to-one manner.

Optionally, in the above display panel provided by the embodiments of the disclosure, the chip on film further includes: levitating pins one-to-one corresponding to the cell test pins.

Optionally, in the above display panel provided by the embodiments of the disclosure, the connection pins and the levitating pins are located on a side, facing to the display cell, of the chip on film.

Optionally, in the above display panel provided by the embodiments of the disclosure, the display panel further includes: an anisotropic conductive film located between the display cell and the chip on film, and an orthographic projection of the anisotropic conductive film on the display cell at least completely covers the display pins.

Optionally, in the above display panel provided by the embodiments of the disclosure, the orthographic projection of the anisotropic conductive film on the display cell completely covers the display pins and the cell test pins.

Optionally, in the above display panel provided by the embodiments of the disclosure, the display pins are arranged in a first direction and extend in a second direction.

The cell test pins are located on two sides of the display pins in the first direction.

Optionally, in the above display panel provided by the embodiments of the disclosure, the numbers of the cell test pins on the two sides of the display pins in the first direction are the same.

Optionally, in the above display panel provided by the embodiments of the disclosure, the display cell further includes: a plurality of signal lines in a display region of the display cell.

The signal lines are bent from the display surface of the display cell to a side facing away from the display surface of the display cell and extend to the bonding region of the display cell, and are electrically connected to the display pins in a one-to-one corresponding manner.

Optionally, in the above display panel provided by the embodiments of the disclosure, the display cell further includes: a plurality of test lines arranged at a periphery of the display region of the display cell and electrically connected to the signal lines in a one-to-one corresponding manner.

The test lines are bent from the display surface of the display cell to the side, facing away from the display surface of the display panel, of the display panel and extend to the bonding region of the display cell, and are electrically connected to the cell test pins in a one-to-one corresponding manner.

Optionally, in the above display panel provided by the embodiments of the disclosure, the bonding region of the display cell is located on the side, facing away from the display surface of the display cell, of the display cell.

Optionally, in the above display panel provided by the embodiments of the disclosure, the bonding region of the display cell is located on the side of the display surface of the display cell (i.e., the display surface side of the display cell).

In another aspect, embodiments of the disclosure further provide a display device, including the above display panel.

DETAILED DESCRIPTION OF THE EMBODIMENTS

Figure 1:
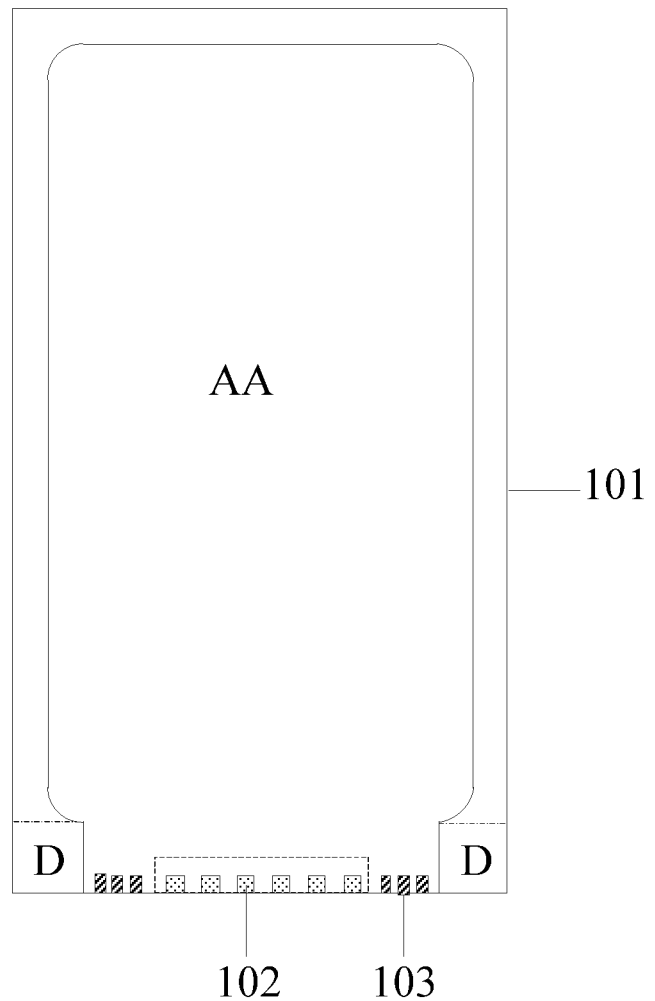
FIG. 1 is a structural schematic diagram of a display panel before cutting of a Dummy region, provided by an embodiment of the present disclosure.

In order to make the objectives, technical solutions and advantages of the embodiments of the disclosure clearer, the technical solutions in the embodiments of the disclosure are described clearly and completely below in conjunction with the accompanying drawings in the embodiments of the disclosure. The thicknesses and shapes of film layers in the drawings do not reflect real scales, and are merely to illustrate the contents of the disclosure. Obviously, the described embodiments are a part of the embodiments of the disclosure, not all the embodiments. Based on the described embodiments of the disclosure, all other embodiments obtained by those of ordinary skill in the art without creative work shall fall within the protection scope of the disclosure.

Unless otherwise defined, technical terms or scientific terms used herein shall be ordinary meanings as understood by those of ordinarily skill in the art of the disclosure. The words "first", "second" and similar words used in the specification and claims of the disclosure do not denote any order, quantity or importance, but are merely used to distinguish different components. The word "comprise" or "include" or the like means that the element or item preceding the word covers the element or object listed after the word and its equivalents, without excluding other elements or objects. "Inner", "outer", "upper", "lower" and the like are only used to denote relative position relations, and when an absolute position of a described object changes, the relative position relationship may also change correspondingly.

A border, particularly a lower border, of an OLED display screen used in a mobile phone terminal is becoming narrower and narrower. In a related technology, a fold-back scheme is usually used to ensure that the OLED display screen has a narrower lower border. The fold-back scheme is that a line outgoing region of a display screen is narrowed, and the narrowed line outgoing region is folded to the back of the display screen to realize bonding with a Chip On Film (COF) to thus form two Dummy regions on left and right sides of the line outgoing region of the display screen, and laser cutting is performed on a subsequent module (MDL) end to cut off chamfered Dummy regions. In addition, after a manufacturing stage of display cell ends, a lighting on-off test needs to be performed on the display screen. The display screen is delivered to the MDL end only if the lighting on-off test is OK. Several cell test pins need to be arranged for the lighting on-off test of the cell. After the cell test pins are subjected to the lighting on-off test, the significance of the existence of the cell test pins is completed. In all related technologies, the cell test pins are usually arranged in the chamfered Dummy regions, and are removed when the Dummy regions are cut off. However, since one ends of connection lines for the cell test pins in the display screen are connected to the cell test pins, and the other ends of the connection lines are connected to signal lines of the display screen to realize the lighting on-off test. After the Dummy regions are cut by laser at the MDL end, the connection lines for the cell test pins would be exposed at the cut positions, and the exposed connection lines are eroded by water, oxygen, etc., and are likely to be in short circuit with each other, which is equivalent to causing poor short circuit between the signal lines, thereby causing that the display screen displays nothing or displays things abnormally during verification of the credibility at the MDL end.

Figure 2:
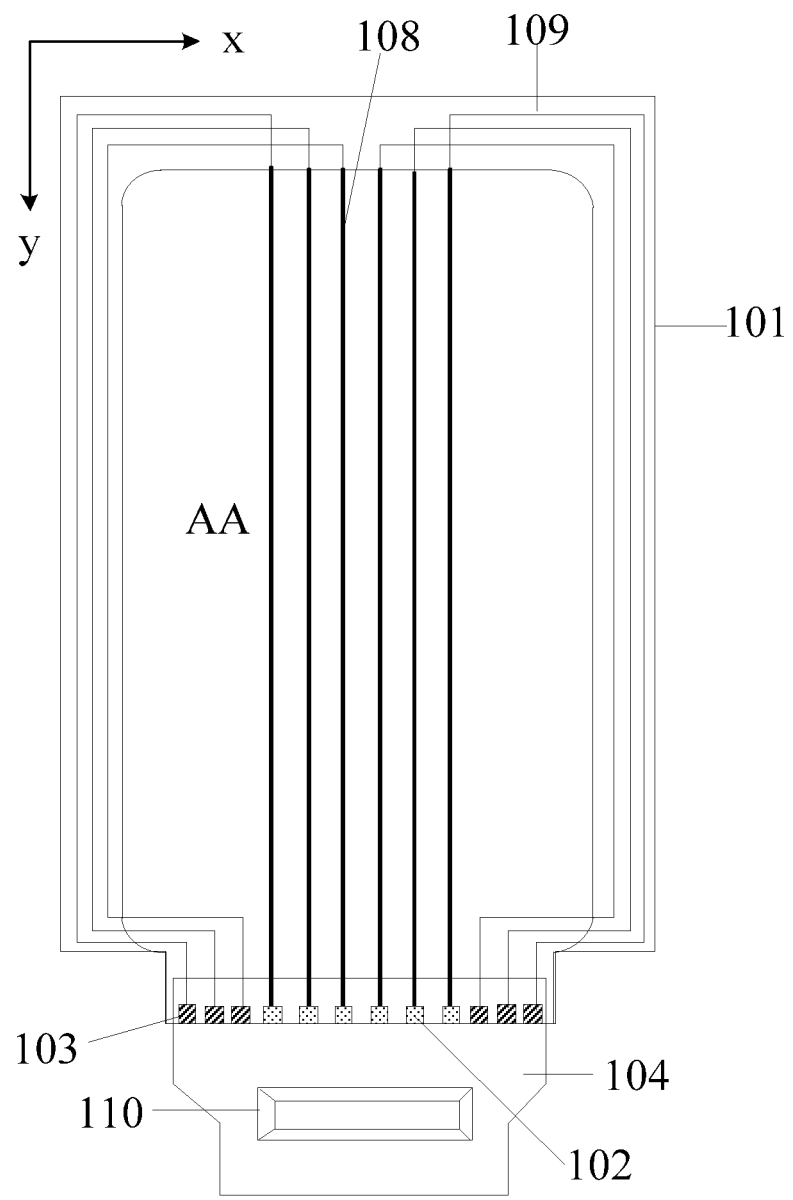
FIG. 2 is a structural schematic diagram of a display panel provided by an embodiment of the present disclosure.

For the above technical problems in the related technology, embodiments of the disclosure provide a display panel, as shown in FIG. 1 and FIG. 2. The display panel includes a display cell 101 and a chip on film 104.

The display cell 101 includes a plurality of display pins 102 and a plurality of cell test pins 103. The display pins 102 and the cell test pins 103 are arranged in a bonding region of the display cell 101.

The chip on film 104 is bonded to a side facing away from a display surface of the display cell 101, and an orthographic projection of the chip on film 104 on the display cell 101 completely covers the display pins 102 and the cell test pins 103.

In the above display panel provided by the embodiments of the disclosure, the cell test pins 103 are arranged in the bonding region instead of Dummy regions D, thereby avoiding poor short circuit caused by exposure of connection lines for the cell test pins 103 after the Dummy regions D are cut off. Further, the chip on film 104 is used to shield the cell test pins 103, thereby avoiding direct exposure of the cell test pins 103 and preventing the poor short circuit caused by the fact that the cell test pins 103 are eroded by water, oxygen, etc. Based on this, the display panel provided by the disclosure effectively solves no displaying and abnormal displaying in a credibility test process at an MDL end due to the cutting of the cell test pins 103.

Figure 3:
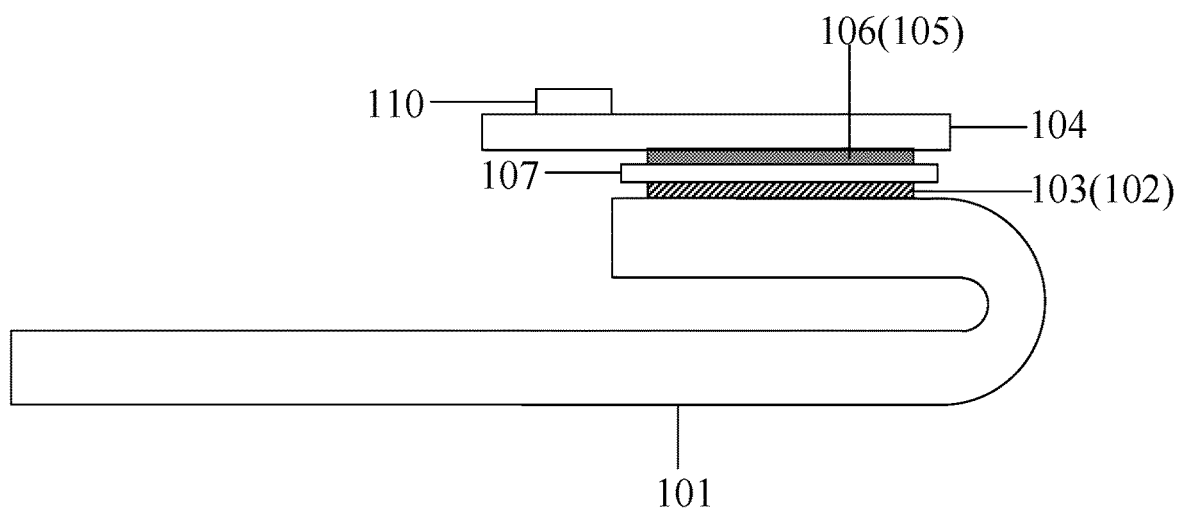
FIG. 3 is another structural schematic diagram of a display panel provided by an embodiment of the present disclosure.

Optionally, in the above display panel provided by the embodiments of the disclosure, as shown in FIG. 3, the chip on film 104 includes: connection pins 105 bonded to the display pins 102 in a one-to-one manner, so as to load driving signals to the display pins 102 by means of the connection pins 105.

Optionally, in the above display cell 101 provided by the embodiments of the disclosure, as shown in FIG. 3, the chip on film 104 further includes: levitating pins 106 (i.e., no signal is loaded) arranged in one-to-one correspondence to the cell test pins 103.

Since the cell test pins 103 are arranged on two sides of the display pins 102, a width of the chip on film 104 need to be increased to realize complete coverage for the cell test pins 103. Under the circumstance that the chip on film 104 is widened, left and right edge portions of the chip on film 104 may upwarp easily. In the disclosure, by means of the arrangement of the levitating pins 106 one-to-one corresponding to the cell test pins 103, the edge portion of the chip on film 104 provided with no pins is narrowed, thereby lowering the upwarping risk of the chip on film 104.

Optionally, in the above display panel provided by the embodiments of the disclosure, as shown in FIG. 3, the connection pins 105 and the levitating pins 106 are located on a side, facing to the display cell 101, of the chip on film 104, so as to directly load signals to the display pins 102 by means of the connection pins 105.

In some embodiments, the connection pins 105 and the levitating pins 106 may also be located on a side, facing away from the display cell 101, of the chip on film 104, and bonding connection between the connection pins 105 and the display pins 102 is realized by means of via hole(s) in the chip on film 104, which is not limited herein.

Optionally, the above display panel provided by the embodiments of the disclosure, as shown in FIG. 3, further includes: an Anisotropic Conductive Film (ACF) 107 located between the display cell 101 and the chip on film 104, and an orthographic projection of the ACF 107 on the display cell 101 at least completely covers the display pins 102. It should be noted that FIG. 3 only schematically shows one possible implementation mode of the ACF 107. In an actual product, the ACF 107 may also be partially filled between the adjacent display pins 102.

The ACF 107 is in a conduction state in a direction (direction Z) from the connection pins 105 to the display pins 102 and in an insulation state in a direction perpendicular to the direction Z, and only the connection pins 105 need to load driving signals to the display pins 102, and the levitating pins 106 does not need to load signals to the cell test pins 103, so that it is possible that the ACF 107 is coated between the connection pins 105 and the display pins 102 only, that is, the orthographic projection of the ACF 107 on the display cell 101 need to be set to completely cover the display pins 102.

Optionally, in the display panel provided by the embodiments of the disclosure, as shown in FIG. 3, the orthographic projection of the ACF 107 on the display cell 101 completely covers the display pins 102 and the cell test pins 103.

The ACF 107 can realize unilateral conduction and also has an adhesion characteristic, so that a bonding effect of the chip on film 104 and the display cell 101 is ensured by means of setting the orthographic projection of the ACF 107 on the display cell 101 to completely cover the display pins 102 and the cell test pins 103. On the other hand, the ACF 107 completely covers the cell test pins 103 to further prevent water, oxygen and the like from eroding the cell test pins 103, thereby greatly avoiding the risk of short circuit between the cell test pins 103.

Optionally, in the above display panel provided by the embodiments of the disclosure, as shown in FIG. 2, the display pins 102 are arranged in a first direction x and extend in a second direction y.

The cell test pins 103 are located on two sides of the display pins 102 in the first direction x.

The display pins 102 in the related technology are arranged in the bonding region. In the present disclosure, the cell test pins 103 are additionally arranged in the bonding region, so as to compatible to a manufacturing process of the display pins 102 in the related technology to the maximum extent. The cell test pins 103 can be additionally arranged on the two sides of the display pins 102 without changing the positions of the display pins 102. That is, the bonding region may be enlarged appropriately to simultaneously arrange the display pins 102 and the cell test pins 103 in the bonding region. During specific implementation, the cell test pins 103 may also be arranged on single sides of the display pins 102, which is not limited herein.

Optionally, in the display panel provided by the embodiments of the disclosure, as shown in FIG. 2, in the first direction x, the numbers of the cell test pins 103 on the two sides of the display pins 102 are the same or similar.

The cell test pins 103 are uniformly arranged on the two sides of the display pins 102, so that test lines extending from the display panel in the second direction (i.e., a vertical direction in the figure) to be electrically connected to the cell test pins 103 may be uniformly distributed in border regions of left and right sides of a display region AA, thereby avoiding that a narrow-border effect is not achieved due to too many test lines arranged in the border region of the left side or the right side.

Optionally, in the above display panel provided by the embodiments of the disclosure, in order to realize loading of driving signals required by pixels, as shown in FIG. 2, the display cell 101 further includes: a plurality of signal lines 108 in the display region of the display cell 101. The signal lines 108 are electrically connected to the display pins 102 in a one-to-one corresponding manner.

In some embodiments, the signal lines 108 include, but are not limited to, gate lines, data lines and power lines (VDD). FIG. 2 schematically shows the signal lines 108 represented by the data lines.

Optionally, in the above display panel provided by the embodiments of the disclosure, in order to realize the lighting on-off test, the display cell 101 further includes: a plurality of test lines 109 arranged at a periphery of the display region AA of the display cell 101 and electrically connected to the signal lines 108 in a one-to-one corresponding manner. The test lines 109 are electrically connected to the cell test pins 103 in a one-to-one corresponding manner.

In some embodiments, the periphery of the display region AA refers to a border region of the display cell 101 having no display function.

In the above display panel provided by the embodiments of the disclosure, as shown in FIG. 3, the bonding region of the display cell 101 is located on the side facing away from the display surface of the display cell 101. In some embodiments, the chip on film 104 may be bonded to the back of the display cell 101 after a lower border of the display cell 101 is bent to the back, and a contact region of the chip on film 104 and the display cell 101 is the bonding region. The signal lines 108 located on the side of the display surface of the display cell 101 are bent to the back and extend to the bonding region of the display cell 101 to realize electrical connection to the display pins 102, and the test lines 109 located on the side of the display surface of the display cell 101 are bent to the back and extend to the bonding region of the display cell 101 to realize electrical connection to the cell test pins 103.

Figure 4:
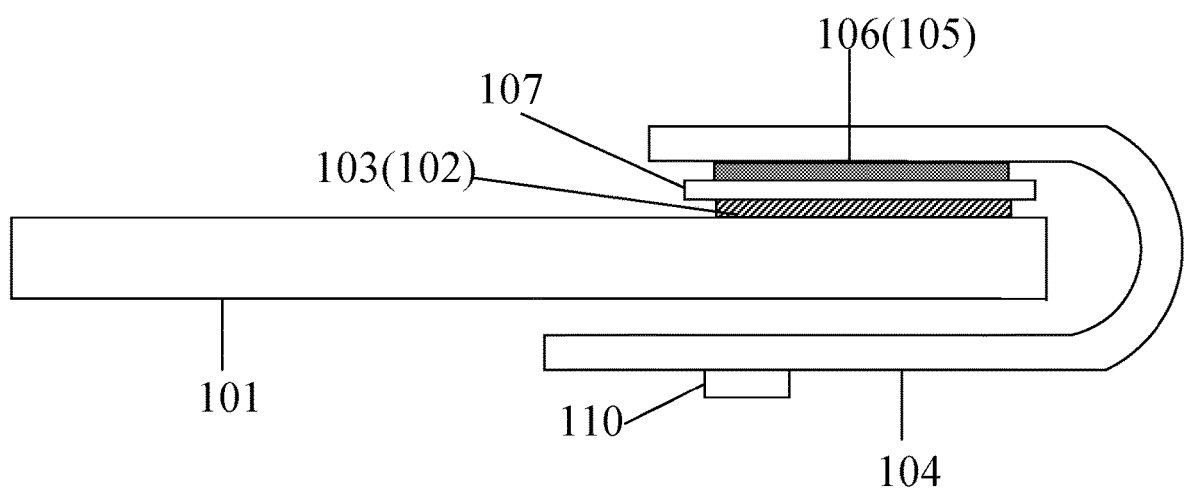
FIG. 4 is yet another structural schematic diagram of a display panel provided by an embodiment of the present disclosure.

In the above display panel provided by the embodiments of the disclosure, as shown in FIG. 4, the bonding region of the display cell 101 is located on the side of the display surface of the display cell. The chip on film 104 may be bent to the back of the display cell 101 after the chip on film 104 is bonded to a lower border region on the side of the display surface of the display cell 101, and a contact region of the chip on film 104 and the display cell 101 is the bonding region. The signal lines 108 located on the side of the display surface of the display cell 101 directly extend to the bonding region of the display cell 101 to realize electrical connection to the display pins 102; and the test lines 109 located on the side of the display surface of the display cell 101 directly extend to the bonding region of the display cell 101 to realize electrical connection to the cell test pins 103.

Generally, control signals required for pixel driving in the display panel are from an external display driver integrated circuit (IC) 110, and are transmitted to the signal lines 108 of the display panel via the chip on film 104. Therefore, in the above display panel provided by the embodiments of the disclosure, as shown in FIG. 3 and FIG. 4, the display panel may further include: the display driver IC 110 bonded to the side, facing away from the display cell 101, of the chip on film 104.

Optionally, in the above display panel provided by the embodiments of the disclosure, the display cell may be a flexible display cell or a rigid display cell. Preferably, the display cell is the flexible display cell, such as organic light emitting diodes (OLEDs) display cell, or quantum dot light emitting diodes (QLED) display panel, which is not limited herein.

Based on the same inventive concept, embodiments of the disclosure further provide a display device, including the above display panel provided by the embodiments of the disclosure. The display device may be: any product or component having a display function, such as a mobile phone, a flat computer, a television, a display, a notebook computer, a digital camera, a navigator, a smart watch, a fitness wristband, a personal digital assistant. The existence of other indispensable components of the display device should be understood by those skilled in the art, is not described in detail herein and should not be construed as limiting the disclosure. In addition, the principle of the display device for solving problems is similar to that of the above display panel, so that the implementation of the display device may refer to the embodiments of the display panel, and repeated descriptions will be omitted.

In the above display panel and the display device which are provided by the embodiments of the disclosure, the display cell is included. The display cell includes: the plurality of display pins and the plurality of cell test pins, which are arranged in the bonding region of the display cell; and the chip on film bonded to the side facing away from the display surface of the display cell. The orthographic projection of the chip on film on the display cell completely covers the display pins and the cell test pins. The cell test pins are arranged in the bonding region instead of the Dummy regions, thereby avoiding poor short circuit caused by exposure of the connection lines for the cell test pins after the Dummy regions are cut off. Further, the chip on film is used to shield the cell test pins, thereby avoiding the direct exposure of the cell test pins and preventing the poor short circuit caused by the fact that the cell test pins are eroded by water, oxygen, etc. Based on this, the display panel provided by the disclosure effectively solves no displaying and abnormal displaying in the credibility test process at the MDL end due to the cutting of the cell test pins.

Obviously, those skilled in the art can make various changes and transformations to the embodiments of the disclosure without departing from the spirit and scope of the disclosure. Therefore, if these changes and transformations of the embodiments of the disclosure fall within the scope of the claims of the disclosure and equivalent technologies thereof, the disclosure is intended to include these changes and transformations.

What is claimed is:

1. A display panel, comprising:
   a display cell, comprising:
      a plurality of display pins; and
      a plurality of cell test pins;
      wherein the display pins and the cell test pins are arranged in a bonding region of the display cell;
   a chip on film, bonded to a side facing away from a display surface of the display cell, an orthographic projection of the chip on film on the display cell completely covering the display pins and the cell test pins;
   a plurality of signal lines in a display region of the display cell; wherein the signal lines are electrically connected to the display pins in a one-to-one manner; and
   a plurality of test lines arranged at a periphery of the display region of the display cell and electrically connected to the signal lines in a one-to-one manner; wherein the test lines are electrically connected to the cell test pins in a one-to-one manner.

2. The display panel according to claim 1, wherein the chip on film comprises:
   connection pins bonded to the display pins in a one-to-one manner.

3. The display panel according to claim 2, wherein the chip on film further comprises:
   levitating pins bonded to the cell test pins in a one-to-one manner.

4. The display panel according to claim 3, wherein the connection pins and the levitating pins are on a side, facing to the display cell, of the chip on film.

5. The display panel according to claim 1, further comprising:
   an anisotropic conductive film between the display cell and the chip on film;
   wherein an orthographic projection of the anisotropic conductive film on the display cell at least completely covers the display pins.

6. The display panel according to claim 5, wherein the orthographic projection of the anisotropic conductive film on the display cell completely covers the display pins and the cell test pins.

7. The display panel according to claim 1, wherein:
   the display pins are arranged in a first direction and extend in a second direction; and
   the cell test pins are on two sides of the display pins in the first direction.

8. The display panel according to claim 7, wherein numbers of the cell test pins on the two sides, in the first direction, of the display pins are the same.

9. The display panel according to claim 1, wherein the bonding region of the display cell is on a side facing away from the display surface of the display cell.

10. The display panel according to claim 1, wherein the bonding region of the display cell is on a side of the display surface of the display cell.

11. A display device comprising a display panel, wherein the display panel comprises:
    a display cell, comprising:
       a plurality of display pins; and
       a plurality of cell test pins;
       wherein the display pins and the cell test pins are arranged in a bonding region of the display cell;
    a chip on film, bonded to a side facing away from a display surface of the display cell, an orthographic projection of the chip on film on the display cell completely covering the display pins and the cell test pins;
    a plurality of signal lines in a display region of the display cell; wherein the signal lines are electrically connected to the display pins in a one-to-one manner; and
    a plurality of test lines arranged at a periphery of the display region of the display cell and electrically connected to the signal lines in a one-to-one manner; wherein the test lines are electrically connected to the cell test pins in a one-to-one manner.

12. The display device according to claim 11, wherein the chip on film comprises:
    connection pins bonded to the display pins in a one-to-one manner.

13. The display device according to claim 12, wherein the chip on film further comprises:
    levitating pins bonded to the cell test pins in a one-to-one manner.

14. The display device according to claim 11, further comprising:
    an anisotropic conductive film between the display cell and the chip on film;
    wherein an orthographic projection of the anisotropic conductive film on the display cell at least completely covers the display pins.

15. The display device according to claim 11, wherein:
    the display pins are arranged in a first direction and extend in a second direction; and
    the cell test pins are on two sides of the display pins in the first direction.

16. The display device according to claim 11, wherein the bonding region of the display cell is on:
    a side facing away from the display surface of the display cell; or
    a side of the display surface of the display cell.

* * * * *